(12) United States Patent
You

(10) Patent No.: US 11,121,823 B2
(45) Date of Patent: Sep. 14, 2021

(54) METHOD AND APPARATUS FOR HYBRID AUTOMATIC REPEAT REQUEST IN NON-TERRESTRIAL NETWORK

(71) Applicant: ELECTRONICS AND TELECOMMUNICATIONS RESEARCH INSTITUTE, Daejeon (KR)

(72) Inventor: Duk Hyun You, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 13 days.

(21) Appl. No.: 16/692,401

(22) Filed: Nov. 22, 2019

(65) Prior Publication Data
US 2020/0186293 A1    Jun. 11, 2020

(30) Foreign Application Priority Data

Dec. 10, 2018  (KR) .................. 10-2018-0158256
Nov. 13, 2019  (KR) .................. 10-2019-0145456

(51) Int. Cl.
| H04L 1/18 | (2006.01) |
| H03M 13/27 | (2006.01) |
| H03M 13/00 | (2006.01) |
| H03M 13/05 | (2006.01) |

(52) U.S. Cl.
CPC .......... *H04L 1/1812* (2013.01); *H03M 13/05* (2013.01); *H03M 13/2778* (2013.01); *H03M 13/6312* (2013.01); *H04L 1/1822* (2013.01); *H04L 1/1845* (2013.01); *H04L 1/1861* (2013.01)

(58) Field of Classification Search
CPC ...................................... H04L 1/1812
USPC ................... 714/748, 749, 752, 747
See application file for complete search history.

(56) References Cited

U.S. PATENT DOCUMENTS

| 9,654,584 | B2 | 5/2017 | Han et al. |
| 2010/0272033 | A1 | 10/2010 | Fwu et al. |
| 2012/0089882 | A1 | 4/2012 | Kim et al. |
| 2014/0293884 | A1* | 10/2014 | Larsson ............... H04L 1/0073 |
| | | | 370/329 |
| 2015/0109996 | A1 | 4/2015 | Lee et al. |
| 2016/0206604 | A1* | 7/2016 | Metcalf .................... A61K 9/08 |
| 2016/0219457 | A1* | 7/2016 | Nammi ............... H04B 1/1036 |
| 2016/0241362 | A1 | 8/2016 | El-Khamy et al. |
| 2017/0164263 | A1* | 6/2017 | Lindoff ............... H04W 72/046 |

(Continued)

OTHER PUBLICATIONS

3GPP TR 38.811 V15.0.0 (Jun. 2018), 3rd Generation Partnership Project; Technical Specification Group Radio Access Network; Study on New Radio (NR) to support non terrestrial networks, (Release 15), pp. 1-73.

(Continued)

*Primary Examiner* — Fritz Alphonse
(74) *Attorney, Agent, or Firm* — Rabin & Berdo, P.C.

(57) ABSTRACT

Methods and apparatuses for HARQ in a non-terrestrial network are disclosed. An operation method of a first node may comprise receiving a transport block (TB) from a second node; classifying total soft bits for the TB into information values and sign values; configuring the information values of the total soft bits into one or more subsets; performing a compression operation on each of the one or more subsets; and performing a compression operation on the sign values. Therefore, performance of the communication system can be improved.

20 Claims, 13 Drawing Sheets

(56) References Cited

U.S. PATENT DOCUMENTS

2018/0183549 A1    6/2018  Cho et al.
2018/0227084 A1*   8/2018  Lu .................... H04L 5/0035
2018/0248659 A1    8/2018  You et al.

OTHER PUBLICATIONS

3GPP TR 38.821 V0.3.0 (Nov. 2018), 3rd Generation Partnership Project; Technical Specification Group Radio Access Network; Solutions for NR to support non-terrestrial networks (NTN), (Release 16), pp. 1-33.

3GPP TS 38.211 V15.3.0 (Sep. 2018), 3rd Generation Partnership Project; Technical Specification Group Radio Access Network; NR; Physical channels and modulation, (Release 15), pp. 1-93.

3GPP TS 38.212 V15.3.0 (Sep. 2018), 3rd Generation Partnership Project; Technical Specification Group Radio Access Network; NR; Multiplexing and channel coding, (Release 15), pp. 1-95.

3GPP TS 38.213 V15.3.0 (Sep. 2018), 3rd Generation Partnership Project; Technical Specification Group Radio Access Network; NR; Physical layer procedures for control, (Release 15), pp. 1-101.

3GPP TS 38.214 V15.3.0 (Sep. 2018), 3rd Generation Partnership Project; Technical Specification Group Radio Access Network; NR; Physical layer procedures for data, (Release 15), pp. 1-101.

* cited by examiner $R_0$: RE TO WHICH REFERENCE SIGNAL IS MAPPED
I: SYMBOL INDEX WITHIN SLOT

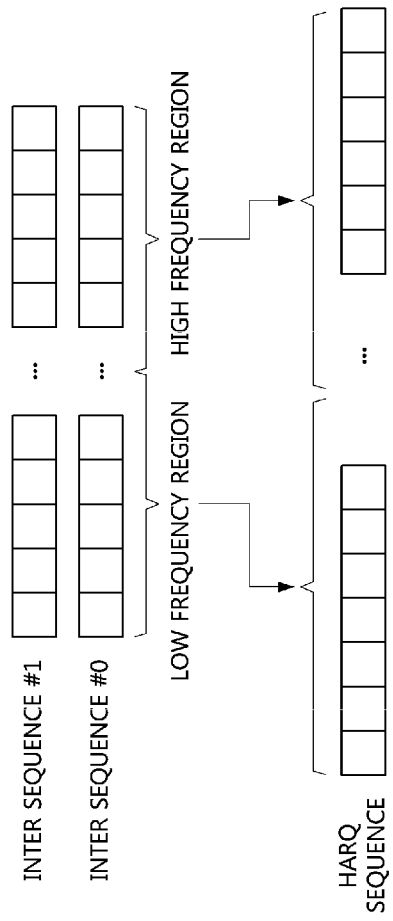

METHOD AND APPARATUS FOR HYBRID AUTOMATIC REPEAT REQUEST IN NON-TERRESTRIAL NETWORK

CROSS-REFERENCE TO RELATED APPLICATIONS

This application claims priority to Korean Patent Applications No. 10-2018-0158256 filed on Dec. 10, 2018 and No. 10-2019-0145456 filed on Nov. 13, 2019 in the Korean Intellectual Property Office (KIPO), the entire contents of which are hereby incorporated by reference.

BACKGROUND

1. Technical Field

The present disclosure relates to a hybrid automatic repeat request (HARD) technique in a non-terrestrial network (NTN), and more particularly, to a compression technique for soft bits in a receiver.

2. Related Art

The communication system (hereinafter, a new radio (NR) communication system) using a higher frequency band (e.g., a frequency band of 6 GHz or higher) than a frequency band (e.g., a frequency band lower below 6 GHz) of the long term evolution (LTE) (or, LTE-A) is being considered for processing of soaring wireless data. The NR communication system may support not only a frequency band below 6 GHz but also 6 GHz or higher frequency band, and may support various communication services and scenarios as compared to the LTE communication system. For example, usage scenarios of the NR communication system may include enhanced mobile broadband (eMBB), ultra-reliable low-latency communication (URLLC), massive machine type communication (mMTC), and the like.

The NR communication network may provide communication services to terminals located in terrestrial sites. Recently, the demand for communication services for planes, drones, satellites, etc., which are located in the non-terrestrial places, is increasing. To this end, techniques for a non-terrestrial network (NTN) are being discussed. The NTN can be implemented based on the NR technology. For example, in the NTN, the communication between a satellite and terrestrial communication nodes (e.g., user equipment (UE)) or non-terrestrial communication nodes (e.g., airplanes, drones, or the like) may be performed based on the NR technology. In the NTN, a satellite may perform functions of a base station in the NR communication network.

Meanwhile, a round trip delay (RTD) between a satellite and a communication node in the NTN is longer than an RTD between a base station and a communication node in the NR communication network, and in a hybrid automatic repeat request (HARQ) procedure, the number of HARQ processes (e.g., HARQ process identifiers) may increase in proportion to the RTD. In addition, since the size of an HARQ memory (e.g., HARQ buffer) in which soft bits are stored is proportional to the number of HARQ processes, the HARQ memory having a large size may be needed in the NTN. As the size of the HARQ memory increases, problems arise in implementation and design. Therefore, a method for suppressing the increase in the size of the HARQ memory is required.

SUMMARY

Accordingly, exemplary embodiments of the present disclosure provide a method and an apparatus for compressing soft bits, which suppress increase in the size of hybrid automatic repeat request (HARQ) memory in non-terrestrial networks.

According to exemplary embodiments of the present disclosure, an operation method of a first node in a communication network may comprise receiving a transport block (TB) from a second node; classifying total soft bits for the TB into information values and sign values; configuring the information values of the total soft bits into one or more subsets; performing a compression operation on each of the one or more subsets; and performing a compression operation on the sign values.

The total soft bits may be original soft bits generated based on the TB when the TB is an initial transmitted TB, and the total soft bits may be a combination of the original soft bits generated based on the TB and previous soft bits stored in a memory of the first node when the TB is a re-transmitted TB.

The performing of the compression operation on each of the one or more subsets may further comprise mapping each of the one or more subsets to a subblock consisting of a plurality of resource elements (REs); performing a transform coding operation on each of the subblocks to which the one or more subsets are mapped; performing a thresholding operation on a result of the transform coding operation; generating an intra sequence based on a result of the threshold holding operation; and generating compressed information values by performing an encoding operation on each of the intra sequences corresponding to the one or more subsets.

The intra sequence may be generated based on a zigzag read scheme or a diagonal read scheme.

The encoding operation may be performed based on a run-length encoding algorithm.

The compression operation on the sign values may be performed based on a Lempel-Ziv-Welch (LZW) algorithm.

The performing of the compression operation on each of the one or more subsets may further comprise mapping each of the one or more subsets to a subblock consisting of a plurality of REs; performing a transform coding operation on each of the subblocks to which the one or more subsets are mapped; performing a threshold holding operation on a result of the transform coding operation; generating an intra sequence based on a result of the thresholding operation; generating one inter sequence consisting of the intra sequences corresponding to the one or more subsets; and generating compressed information values by performing an encoding operation on the one inter sequence.

The one inter sequence may be generated by applying matrix interleaving to the intra sequences.

Furthermore, according to exemplary embodiments of the present disclosure, an operation method of a first node in a communication network may comprise receiving a first transport block (TB) and a second TB from a second node; configuring first information values included in first soft bits for the first TB into one or more first subsets; generating first intra sequences by performing a transform coding operation on each of the one or more first subsets; configuring second information values included in second soft bits for the second TB into one or more second subsets; generating second intra sequences by performing the transform coding operation on each of the one or more second subsets; generating one hybrid automatic repeat request (HARQ) sequence including a first inter sequence consisting of the first intra sequences and a second inter sequence consisting of the second intra sequences;

and generating compressed information values by performing an encoding operation on the one HARQ sequence.

The encoding operation may be performed based on a run-length encoding algorithm.

The generating of the first intra sequences may further comprise mapping each of the one or more first subsets to a subblock consisting of a plurality of resource elements (REs); performing the transform coding operation on each of the subblocks to which the one or more first subsets are mapped; performing a thresholding operation on a result of the transform coding operation; and generating the first intra sequences based on a result of the threshold holding operation.

The operation method may further comprise performing a compression operation on first sign values included in the first soft bits and second sign values included in the second soft bits, wherein the compression operation on the first sign values and the second sign values may be performed based on a Lempel-Ziv-Welch (LZW) algorithm.

Furthermore, according to exemplary embodiments of the present disclosure, a first node in a communication network may comprise a processor and a memory storing at least one instruction executable by the processor, wherein when executed by the processor, the at least one instruction may configures the processor to receive a transport block (TB) from a second node; classify total soft bits for the TB into information values and sign values; configure the information values of the total soft bits into one or more subsets; perform a compression operation on each of the one or more subsets; and perform a compression operation on the sign values.

The total soft bits may be original soft bits generated based on the TB when the TB is an initial transmitted TB, and the total soft bits may be a combination of the original soft bits generated based on the TB and previous soft bits stored in a memory of the first node when the TB is a re-transmitted TB.

In the performing of the compression operation on each of the one or more subsets, the at least one instruction may further configure the processor to map each of the one or more subsets to a subblock consisting of a plurality of resource elements (REs); perform a transform coding operation on each of the subblocks to which the one or more subsets are mapped; perform a thresholding operation on a result of the transform coding operation; generate an intra sequence based on a result of the threshold holding operation; and generate compressed information values by performing an encoding operation on each of the intra sequences corresponding to the one or more subsets.

The intra sequence may be generated based on a zigzag read scheme or a diagonal read scheme.

The encoding operation may be performed based on a run-length encoding algorithm. The compression operation on the sign values may be performed based on a Lempel-Ziv-Welch (LZW) algorithm.

In the performing of the compression operation on each of the one or more subsets, the at least one instruction may further configure the processor to map each of the one or more subsets to a subblock consisting of a plurality of REs; perform a transform coding operation on each of the subblocks to which the one or more subsets are mapped; perform a threshold holding operation on a result of the transform coding operation; generate an intra sequence based on a result of the thresholding operation; generate one inter sequence consisting of the intra sequences corresponding to the one or more subsets; and generate compressed information values by performing an encoding operation on the one inter sequence.

The one inter sequence may be generated by applying matrix interleaving to the intra sequences.

According to the exemplary embodiments of the present disclosure, soft bits may be compressed in the receiver, and the compressed soft bits may be stored in the HARQ memory. Therefore, the size of the HARQ memory required for storing the compressed soft bits may be smaller than the size of the HARQ memory required for storing the uncompressed soft bits. Since a compression rate of the soft bits may be determined in consideration of processing latency, the processing latency due to the compression operation on the soft bits can be minimized. Accordingly, the HARQ procedure can be efficiently performed in the NTN, and the data rate and transmission reliability can be improved.

BRIEF DESCRIPTION OF DRAWINGS

Embodiments of the present disclosure will become more apparent by describing in detail embodiments of the present disclosure with reference to the accompanying drawings, in which:

FIG. 17 is a conceptual diagram illustrating a first exemplary embodiment of an HARQ sequence generation operation.

DETAILED DESCRIPTION

Figure 1:
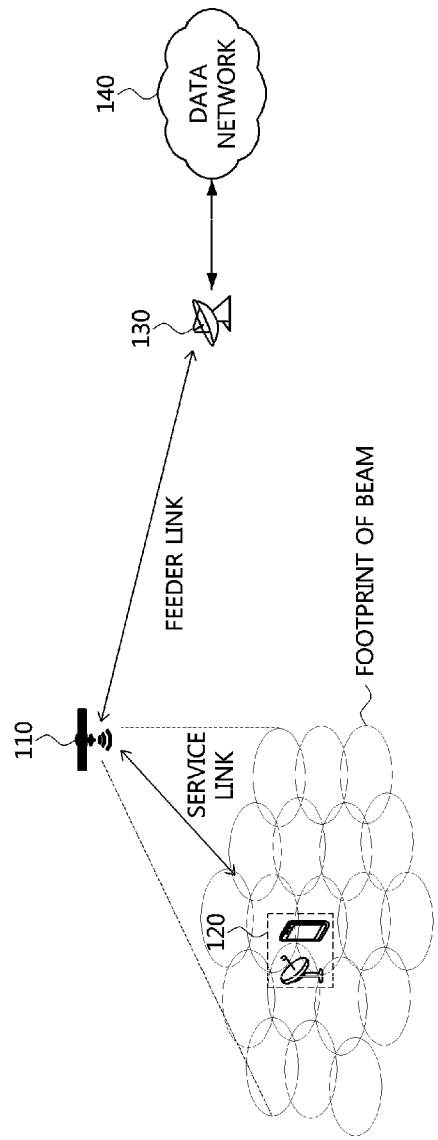
FIG. 1 is a conceptual diagram illustrating a first exemplary embodiment of a non-terrestrial network.

Embodiments of the present disclosure are disclosed herein. However, specific structural and functional details disclosed herein are merely representative for purposes of describing embodiments of the present disclosure, however, embodiments of the present disclosure may be embodied in many alternate forms and should not be construed as limited to embodiments of the present disclosure set forth herein.

Accordingly, while the present disclosure is susceptible to various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present disclosure will be described in greater detail with reference to the accompanying drawings. In order to facilitate general understanding in describing the present disclosure, the same components in the drawings are denoted with the same reference signs, and repeated description thereof will be omitted.

A communication network to which exemplary embodiments according to the present disclosure are applied will be described. The communication system may be a non-terrestrial network (NTN), a 4G communication network (e.g., long-term evolution (LTE) communication network), a 5G communication network (e.g., new radio (NR) communication network), or the like. The 4G communication network and the 5G communication network may be classified as terrestrial networks.

The NTN may operate based on the LTE technology and/or the NR technology. The NTN may support communications in frequency bands below 6 GHz as well as in frequency bands above 6 GHz. The 4G communication network may support communications in the frequency band below 6 GHz. The 5G communication network may support communications in the frequency band below 6 GHz as well as in the frequency band above 6 GHz. The communication network to which the exemplary embodiments according to the present disclosure are applied is not limited to the contents described below, and the exemplary embodiments according to the present disclosure may be applied to various communication networks. Here, the communication network may be used in the same sense as the communication system.

FIG. 1 is a conceptual diagram illustrating a first exemplary embodiment of a non-terrestrial network.

Referring to FIG. 1, a non-terrestrial network (NTN) may include a satellite 110, a communication node 120, a gateway 130, a data network 140, and the like. The NTN shown in FIG. 1 may be an NTN based on a transparent payload. The satellite 110 may be a low earth orbit (LEO) satellite, a medium earth orbit (MEO) satellite, a geostationary earth orbit (GEO) satellite, a high elliptical orbit (HEO) satellite, or an unmanned aircraft system (UAS) platform. The UAS platform may include a high altitude platform station (HAPS).

The communication node 120 may include a communication node (e.g., a user equipment (UE) or a terminal) located on a terrestrial site and a communication node (e.g., an airplane, a drone) located on a non-terrestrial place. A service link may be established between the satellite 110 and the communication node 120, and the service link may be a radio link. The satellite 110 may provide communication services to the communication node 120 using one or more beams. The shape of a footprint of the beam of the satellite 110 may be elliptical.

The communication node 120 may perform communications (e.g., downlink communication and uplink communication) with the satellite 110 using LTE technology and/or NR technology. The communications between the satellite 110 and the communication node 120 may be performed using an NR-Uu interface. When dual connectivity (DC) is supported, the communication node 120 may be connected to other base stations (e.g., base stations supporting LTE and/or NR functionality) as well as the satellite 110, and perform DC operations based on the techniques defined in the LTE and/or NR specifications.

The gateway 130 may be located on a terrestrial site, and a feeder link may be established between the satellite 110 and the gateway 130. The feeder link may be a radio link. The gateway 130 may be referred to as a 'non-terrestrial network (NTN) gateway'. The communications between the satellite 110 and the gateway 130 may be performed based on an NR-Uu interface or a satellite radio interface (SRI). The gateway 130 may be connected to the data network 140. There may be a 'core network' between the gateway 130 and the data network 140. In this case, the gateway 130 may be connected to the core network, and the core network may be connected to the data network 140. The core network may support the NR technology. For example, the core network may include an access and mobility management function (AMF), a user plane function (UPF), a session management function (SMF), and the like. The communications between the gateway 130 and the core network may be performed based on an NG-C/U interface.

Alternatively, a base station and the core network may exist between the gateway 130 and the data network 140. In this case, the gateway 130 may be connected with the base station, the base station may be connected with the core network, and the core network may be connected with the data network 140. The base station and core network may support the NR technology. The communications between the gateway 130 and the base station may be performed based on an NR-Uu interface, and the communications between the base station and the core network (e.g., AMF, UPF, SMF, and the like) may be performed based on an NG-C/U interface.

Figure 2:
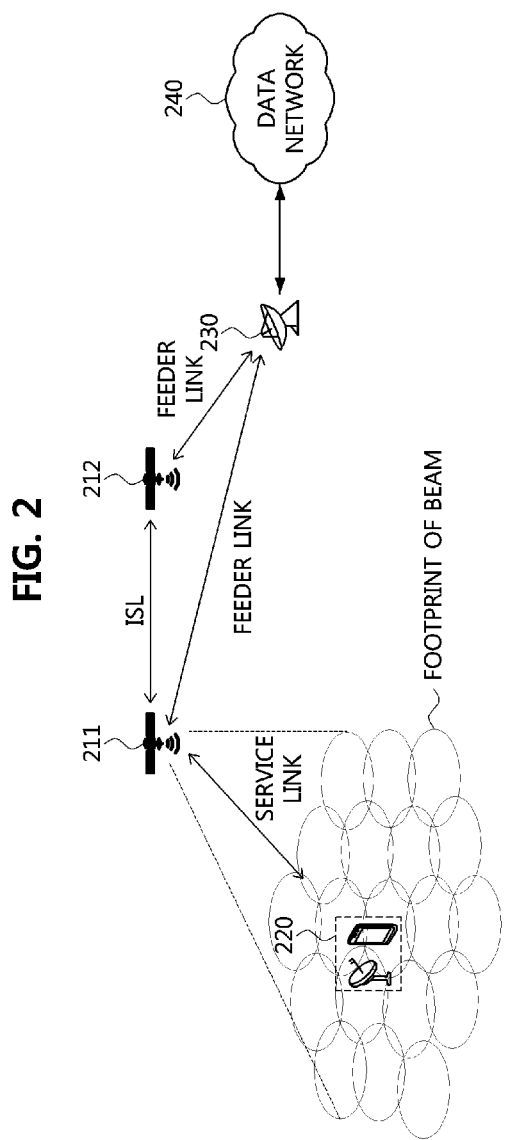
FIG. 2 is a conceptual diagram illustrating a second exemplary embodiment of a non-terrestrial network.

FIG. 2 is a conceptual diagram illustrating a second exemplary embodiment of a non-terrestrial network.

Referring to FIG. 2, a non-terrestrial network may include a first satellite 211, a second satellite 212, a communication node 220, a gateway 230, a data network 240, and the like. The NTN shown in FIG. 2 may be a regenerative payload based NTN. For example, each of the satellites 211 and 212 may perform a regenerative operation (e.g., demodulation, decoding, re-encoding, re-modulation, and/or filtering operation) on a payload received from other entities (e.g., the communication node 220 or the gateway 230), and transmit the regenerated payload.

Each of the satellites 211 and 212 may be a LEO satellite, a MEO satellite, a GEO satellite, a HEO satellite, or a UAS platform. The UAS platform may include a HAPS. The satellite 211 may be connected to the satellite 212, and an inter-satellite link (ISL) may be established between the satellite 211 and the satellite 212. The ISL may operate in an RF frequency band or an optical band. The ISL may be established optionally. The communication node 220 may include a terrestrial communication node (e.g., UE or terminal) and a non-terrestrial communication node (e.g., airplane or drone). A service link (e.g., radio link) may be established between the satellite 211 and communication node 220. The satellite 211 may provide communication services to the communication node 220 using one or more beams.

The communication node 220 may perform communications (e.g., downlink communication or uplink communication) with the satellite 211 using LTE technology and/or NR technology. The communications between the satellite 211 and the communication node 220 may be performed using an NR-Uu interface. When DC is supported, the communication node 220 may be connected to other base stations (e.g., base stations supporting LTE and/or NR functionality) as well as the satellite 211, and may perform DC operations based on the techniques defined in the LTE and/or NR specifications.

The gateway 230 may be located on a terrestrial site, a feeder link may be established between the satellite 211 and the gateway 230, and a feeder link may be established between the satellite 212 and the gateway 230. The feeder link may be a radio link. When the ISL is not established between the satellite 211 and the satellite 212, the feeder link between the satellite 211 and the gateway 230 may be established mandatorily.

The communications between each of the satellites 211 and 212 and the gateway 230 may be performed based on an NR-Uu interface or an SRI. The gateway 230 may be connected to the data network 240. There may be a core network between the gateway 230 and the data network 240. In this case, the gateway 230 may be connected to the core network, and the core network may be connected to the data network 240. The core network may support the NR technology. For example, the core network may include AMF, UPF, SMF, and the like. The communications between the gateway 230 and the core network may be performed based on an NG-C/U interface.

Alternatively, a base station and the core network may exist between the gateway 230 and the data network 240. In this case, the gateway 230 may be connected with the base station, the base station may be connected with the core network, and the core network may be connected with the data network 240. The base station and the core network may support the NR technology. The communications between the gateway 230 and the base station may be performed based on an NR-Uu interface, and the communications between the base station and the core network (e.g., AMF, UPF, SMF, and the like) may be performed based on an NG-C/U interface.

Meanwhile, entities (e.g., satellites, communication nodes, gateways, etc.) constituting the NTNs shown in FIGS. 1 and 2 may be configured as follows.

Figure 3:
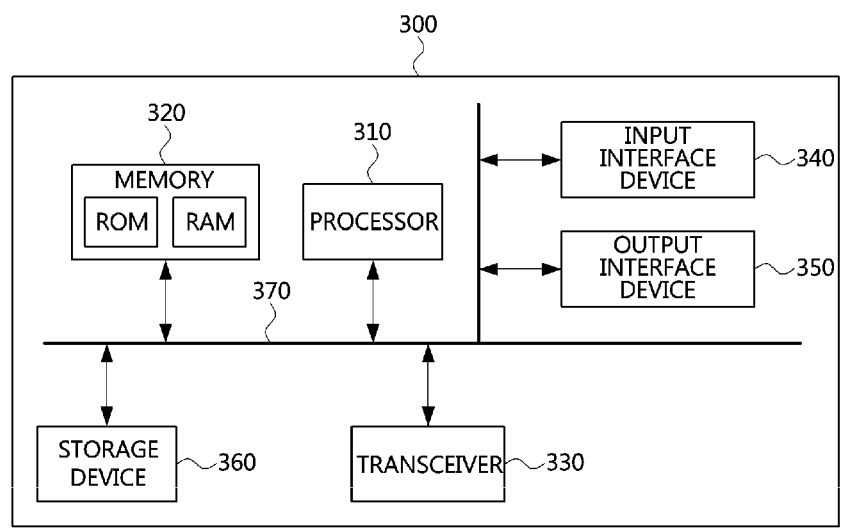
FIG. 3 is a block diagram illustrating a first exemplary embodiment of an entity constituting a non-terrestrial network.

FIG. 3 is a block diagram illustrating a first exemplary embodiment of an entity constituting a non-terrestrial network.

Referring to FIG. 3, an entity 300 may include at least one processor 310, a memory 320, and a transceiver 330 connected to a network to perform communication. In addition, the entity 300 may further include an input interface device 340, an output interface device 350, a storage device 360, and the like. The components included in the entity 300 may be connected by a bus 370 to communicate with each other. However, each component included in the entity 300 may be connected to the processor 310 through a separate interface or a separate bus instead of the common bus 370. For example, the processor 310 may be connected to at least one of the memory 320, the transceiver 330, the input interface device 340, the output interface device 350, and the storage device 360 through a dedicated interface.

The processor 310 may execute at least one instruction stored in at least one of the memory 320 and the storage device 360. The processor 310 may refer to a central processing unit (CPU), a graphics processing unit (GPU), or a dedicated processor on which the methods according to the exemplary embodiments of the present invention are performed. Each of the memory 320 and the storage device 360 may be configured as at least one of a volatile storage medium and a nonvolatile storage medium. For example, the memory 320 may be configured with at least one of a read only memory (ROM) and a random access memory (RAM).

Meanwhile, scenarios in the NTN may be defined as shown in Table 1 below.

TABLE 1

|  | NTN shown in FIG. 1 | NTN shown in FIG. 2 |
| --- | --- | --- |
| GEO | Scenario A | Scenario B |
| LEO | Scenario C1 | Scenario D1 |

TABLE 1-continued

|  | NTN shown in FIG. 1 | NTN shown in FIG. 2 |
|---|---|---|
| (steerable beams) | | |
| LEO (beams moving with satellite) | Scenario C2 | Scenario D2 |

When the satellite 110 in the NTN shown in FIG. 1 is a GEO satellite (e.g., a GEO satellite that supports a transparent function), this may be referred to as 'scenario A'. When the satellites 211 and 212 in the NTN shown in FIG. 2 are GEO satellites (e.g., GEOs that support a regenerative function), this may be referred to as 'scenario B'.

When the satellite 110 in the NTN shown in FIG. 1 is an LEO satellite with steerable beams, this may be referred to as 'scenario C1'. When the satellite 110 in the NTN shown in FIG. 1 is an LEO satellite having beams moving with the satellite, this may be referred to as 'scenario C2'. When the satellites 211 and 212 in the NTN shown in FIG. 2 are LEO satellites with steerable beams, this may be referred to as 'scenario D1'. When the satellites 211 and 212 in the NTN shown in FIG. 2 are LEO satellites having beams moving with the satellites, this may be referred to as 'scenario D2'.

Parameters for the scenarios defined in Table 1 may be defined as shown in Table 2 below.

TABLE 2

|  | Scenarios A and B | Scenarios C and D |
|---|---|---|
| Altitude | 35,786 km | 600 km<br>1,200 km |
| Spectrum (service link) | <6 GHz (e.g., 2 GHz)<br>>6 GHz (e.g., DL 20 GHz, UL 30 GHz) | |
| Maximum channel bandwidth capability (service link) | 30 MHz for band < 6 GHz<br>1 GHz for band > 6 GHz | |
| Maximum distance between satellite and communication node (e.g., UE) at the minimum elevation angle | 40,581 km | 1,932 km (altitude of 600 km)<br>3,131 km (altitude of 1,200 km) |
| Maximum round trip delay (RTD) (only propagation delay) | Scenario A: 541.46 ms (service and feeder links)<br>Scenario B: 270.73 ms (only service link) | Scenario C: (transparent payload: service and feeder links)<br>5.77 ms (altitude of 600 km)<br>41.77 ms (altitude of 1,200 km)<br>Scenario D: (regenerative payload: only service link)<br>12.89 ms (altitude of 600 km)<br>20.89 ms (altitude of 1,200 km) |
| Maximum delay variation within a single beam | 16 ms | 4.44 ms (altitude of 600 km)<br>6.44 ms (altitude of 1,200 km) |
| Maximum differential delay within a cell | 10.3 ms | 3.12 ms (altitude of 600 km)<br>3.18 ms (altitude of 1,200 km) |
| Service link | NR defined in 3GPP | |
| Feeder link | Radio interfaces defined in 3GPP or non-3GPP | |

In addition, in the scenarios defined in Table 1, delay constraints may be defined as shown in Table 3 below.

TABLE 3

|  | Scenario A | Scenario B | Scenario C1-2 | Scenario D1-2 |
|---|---|---|---|---|
| Satellite altitude | 35,786 km | | 600 km | |
| Maximum RTD in a radio interface between base station and UE | 541.75 ms (worst case) | 270.57 ms | 28.41 ms | 12.88 ms |
| Minimum RTD in a radio interface between base station and UE | 477.14 ms | 238.57 ms | 8 ms | 4 ms |

Hereinafter, methods for hybrid automatic repeat request (HARQ) in the communication system will be described. Even when a method (e.g., transmission or reception of a signal) to be performed at a first communication node among communication nodes is described, a corresponding second communication node may perform a method (e.g., reception or transmission of the signal) corresponding to the method performed at the first communication node. That is, when an operation of a terminal is described, a corresponding base station may perform an operation corresponding to the operation of the terminal. Conversely, when an operation of the base station is described, the corresponding terminal may perform an operation corresponding to the operation of the base station.

Referring to the scenarios in the NTN described above, a propagation delay in the NTN may be increased as compared to a propagation delay in the existing communication network since a communication distance in the NTN is longer than that of the existing communication network (e.g., LTE communication network or NR communication network). For reference, the propagation delay in a macro cell of the existing communication network may be 3.33 to 33.33 μs. Since a radius of a micro cell or femto cell is smaller than the radius of the macro cell, a propagation delay in the micro cell or femto cell may be less than the propagation delay in the macro cell.

In the NTN, a round trip delay (RTD) may be greater than an RTD in the existing communication network. The increased RTD in the NTN may affect an HARQ procedure. In particular, an HARQ memory (e.g., HARQ buffer) in which soft bits are stored may increase in proportion to the RTD (e.g., propagation delay). That is, the required size of the HARQ memory may increase in proportion to the number of HARQ processes (e.g., HARQ process identifiers), the number of HARQ processes may be proportional to the RTD, which is a time required for an HARQ response (e.g., acknowledgement (ACK) or negative ACK (NACK)) for a packet to be fed back, and the RTD may be proportional to the propagation delay. Therefore, the size of the HARQ memory required in the NTN may be much larger than the size of the HARQ memory required in the existing communication system. When the size of the HARQ memory increases, implementation complexity may increase.

The size of the HARQ memory for one transport block (TB) at a transmitter may be referred to as 'A', and A may correspond to the size of the TB (e.g., a transport block size (TBS)) which the transmitter is to transmit. The maximum size of the HARQ memory for one TB at the transmitter may be defined as 'max (A)'. The size of the HARQ memory for one TB (e.g., one HARQ process ID) at a receiver may be referred to as 'G', and the maximum size of the HARQ memory for one TB at the receiver may be defined as 'max (G)'. G may be proportional to A. That is, G may be determined based on A, and max (G) may be designed depending on max (A).

The HARQ procedure may be managed for each HARQ process ID. When transmission of two TBs is supported, one HARQ process ID may correspond to two TBs.

In this case, the HARQ procedure may be managed for each TB in one HARQ process ID. The size $G_{total,tx}$ of the total HARQ memory at the transmitter may be defined as in Equation 1 below.

$$G_{total,tx} \propto N_{HARQ} N_{TB} \max(A) \quad \text{[Equation 1]}$$

$N_{HARQ}$ may indicate the maximum number of HARQ process IDs. $N_{HARQ}$ may be proportional to the RTD. In the NR communication system supporting frequency division duplex (FDD), $N_{HARQ}$ may be 16. $N_{HARQ}$ in the NTN may be much larger than $N_{HARQ}$ in the NR communication system. $N_{TB}$ may indicate the maximum number of TBs that can be transmitted. In the NR communication system, $N_{TB}$ may be two. $N_{TB}$ may be determined based on a channel condition and/or the number of antennas rather than the propagation delay. Thus, the difference between $N_{TB}$ in the NTN and $N_{TB}$ in the NR communication system may not be significant.

The size $G_{total,rx}$ of the total HARQ memory in the receiver may be defined as in Equation 2 below.

$$G_{total,rx} \propto N_{HARQ} N_{TB} B_{soft} \max(G) \quad \text{[Equation 2]}$$

The TB in the receiver may be stored in the HARQ memory in form of soft bits.

Accordingly, $G_{total,rx}$ may be determined based on $B_{soft}$ indicating a bit width of the soft bits, $N_{HARQ}$, $N_{TB}$, and max (G).

For reference, in the scenario A of Table 3, when the maximum RTD is 541.75 ms and a transmission time interval (TTI) is 1 ms, $N_{HARQ}$ may be preferably determined to be 542 or more. That is, when $N_{HARQ}$ is determined to be 542 or more, the decrease in data throughput can be prevented. The length of the TTI may be reduced according to a subcarrier spacing (µ). In this case, $N_{HARQ}$ may be 2µ×542. When $N_{HARQ}$ is 16 in the existing communication network, $N_{HARQ}$ in the NTN may be ((2µ×542)/16) times of $N_{HARQ}$ in the existing communication network. Since the subcarrier spacing µ is 0, 1, 2, 3, or 4 in the NR communication system, $N_{HARQ}$ in the NTN may be 33~542 times that of $N_{HARQ}$ in the existing communication network.

Figure 4:
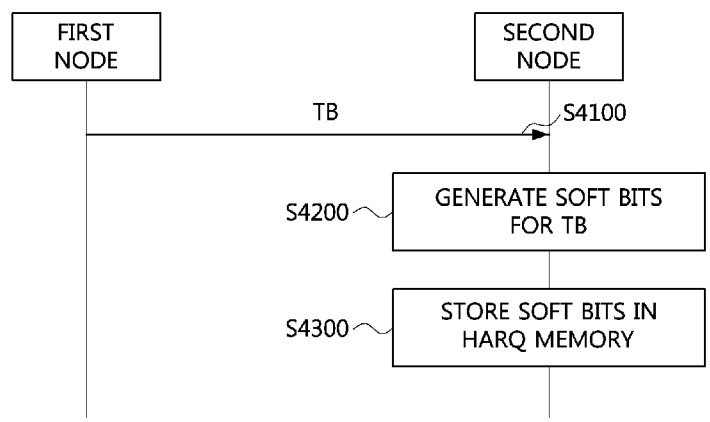
FIG. 4 is a sequence chart illustrating a first exemplary embodiment of a communication method in a non-terrestrial network.

FIG. 4 is a sequence chart illustrating a first exemplary embodiment of a communication method in a non-terrestrial network.

Referring to FIG. 4, an NTN may include a first node, a second node, and the like. The NTN may be the NTN shown in FIG. 1 or the NTN shown in FIG. 2. In the NTN shown in FIG. 1, when the first node is the satellite 110, the second node may be the communication node 120. Alternatively, in the NTN shown in FIG. 1, when the first node is the communication node 120, the second node may be the satellite 110. In the NTN shown in FIG. 2, when the first node is the satellite 211, the second node may be the communication node 220. Alternatively, in the NTN shown in FIG. 2, when the first node is the communication node 220, the second node may be the satellite 211. The first node and the second node may be configured to be the same as or similar to the entity 300 shown in FIG. 3.

If there is data to be transmitted to the second node, the first node may generate a TB including the corresponding data. The TB may correspond to one HARQ process ID. The first node may transmit the TB to the second node (S4100). Here, the communication between the first node and the second node may be performed based on the NR technology. The second node may receive the TB from the first node. The second node may generate soft bits for the received TB (S4200). The soft bits may consist of information values and sign values (e.g., −1, +1) for the information values. Since the information value is represented by an absolute value, in the following exemplary embodiments, the absolute value may mean the information value constituting the soft bits. For example, a value for the TB at a specific sampling time may be expressed as an absolute value indicating a log-likelihood ratio (LLR) with respect to a magnitude of a corresponding signal and a sign value indicating a sign of the corresponding signal. The second node may store the soft bits in the HARQ memory included in the second node (S4300). The step S4300 may be performed based on a non-compression scheme or a compression scheme.

Non-Compression Scheme

Figure 5:
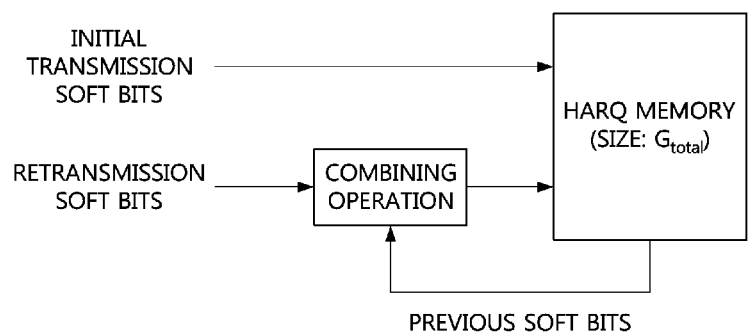
FIG. 5 is a conceptual diagram illustrating a first exemplary embodiment of a method for storing soft bits according to a non-compression scheme.

FIG. 5 is a conceptual diagram illustrating a first exemplary embodiment of a method for storing soft bits according to a non-compression scheme.

Referring to FIG. 5, initial transmission soft bits may be stored in the HARQ memory without a combining operation and a compression operation. The initial transmission soft bits may be soft bits for the TB initially transmitted from the first node. Retransmission soft bits may be combined with previous soft bits (e.g., the initial transmission soft bits) stored in the HARQ memory, and the combined soft bits may be stored in the HARQ memory without a compression operation. The retransmission soft bits may be soft bits for the TB retransmitted from the first node. When the soft bits are stored in HARQ memory without compression, a very large HARQ memory may be needed.

Compression Scheme

Channel characteristics in the time domain of the NTN may be nearly similar. Since a path between the first node and the second node may have a line of sight (LoS) characteristic, the channel characteristic may be flat in the frequency domain. Thus, a probability that the values (e.g., absolute values) of the soft bits are the same in the frequency domain may be high, and a probability that the values (e.g., absolute values) of the soft bits are the same in the time domain may also be high. In this case, the performance when storing the compressed soft bits in the HARQ memory may not be significantly lower than the performance when storing the uncompressed soft bits in the HARQ memory.

Figure 6:
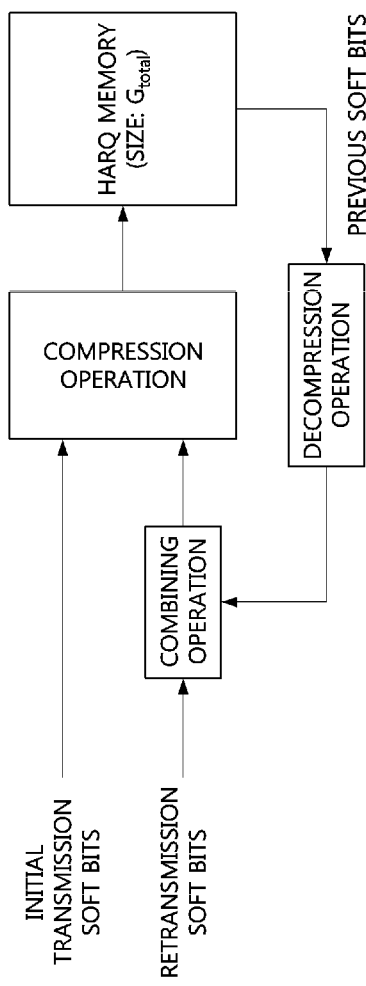
FIG. 6 is a conceptual diagram illustrating a first exemplary embodiment of a method for storing soft bits according to a compression scheme.

FIG. 6 is a conceptual diagram illustrating a first exemplary embodiment of a method for storing soft bits according to a compression scheme.

Referring to FIG. 6, initial transmission soft bits may be compressed and the compressed soft bits may be stored in the HARQ memory. Retransmission soft bits may be combined with the previous soft bits (e.g., the initial transmission soft bits) stored in the HARQ memory. For example, the previous compressed soft bits may be decompressed and the retransmission soft bits may be combined with the decompressed soft bits. The combined soft bits may be stored in the HARQ memory. The compression operation on the soft bits (e.g., the initial transmission soft bits or the combined soft bits) may be performed as follows.

Figure 7:
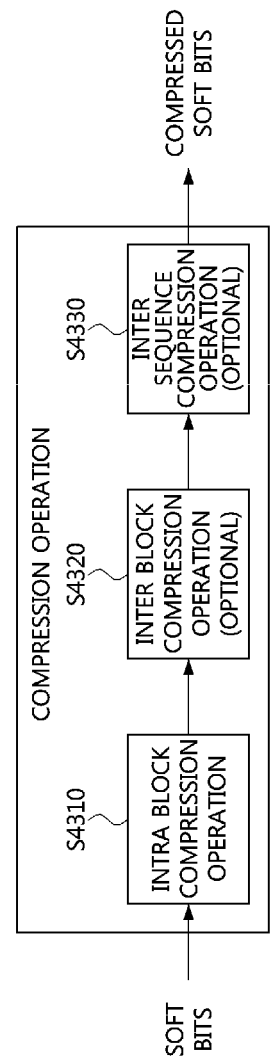
FIG. 7 is a flowchart illustrating a first exemplary embodiment of a compression operation.

FIG. 7 is a flowchart illustrating a first exemplary embodiment of a compression operation.

Referring to FIG. 7, the compression operation may include an intra block compression operation S4310, an inter block compression operation S4320, and an inter sequence compression operation S4330. The intra block compression operation S4310 may be essentially performed, and each of the inter block compression operation S4320 and the inter sequence compression operation S4330 may be optionally performed. The compression operation (e.g., S4310 to S4330) may be performed by the processor 310 shown in FIG. 3. The block may be a subset of a sequence (or, entire sequence) of soft bits (e.g., initial soft bits or combined soft bits). In the following exemplary embodiments, the soft bits may be initial soft bits or combined soft bits. The step S4300 shown in FIG. 4 may include one or more of the steps S4310 to S4330 shown in FIG. 7.

Intra Block Compression Operation

Figure 8:
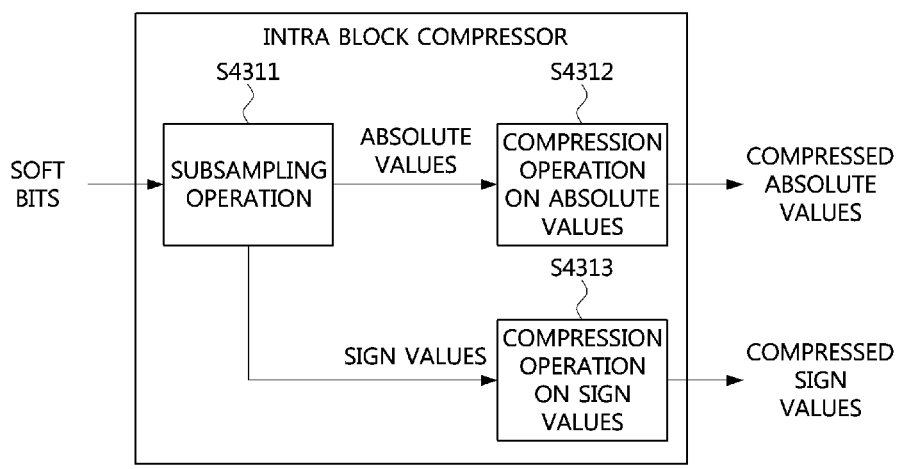
FIG. 8 is a flowchart illustrating a first exemplary embodiment of an intra block compression operation.

FIG. 8 is a flowchart illustrating a first exemplary embodiment of an intra block compression operation.

Referring to FIG. 8, inputs of an intra block compressor may be values (e.g., combined soft bits) in which a TB (e.g., PDSCH) received at a specific time point or interval and a previous TB are combined. Alternatively, the inputs of the intra block compressor may be an initial TB (e.g., initial soft bits). The intra block compressor may perform compression on a subset of the soft bits instead of the entire sequence of the soft bits. The reason is that the implementation of the compression algorithm is difficult when the length of the entire sequence of the soft bits is very long. The sequence of the soft bits may be configured as follows.

Figure 9:
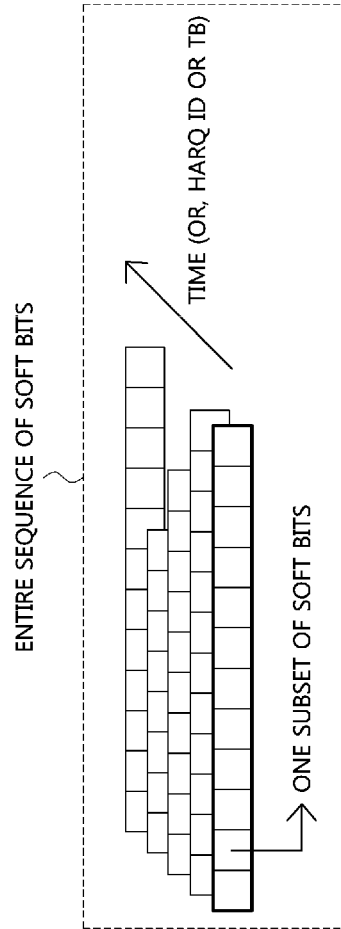
FIG. 9 is a conceptual diagram illustrating a first exemplary embodiment of a sequence of soft bits.

FIG. 9 is a conceptual diagram illustrating a first exemplary embodiment of a sequence of soft bits.

Referring to FIG. 9, the entire sequence of the soft bits may consist of one or more subsets. The subset of the soft bits may consist of soft bits at a specific time point. The intra block compressor may perform the compression operation in units of one or more subsets. The number of subsets processed in one compression operation may be determined according to the performance of the intra block compressor.

Referring back to FIG. 8, the soft bits that are the inputs of the intra block compressor may be subsampled into two subspaces (S4311). For example, the soft bits may be subsampled into absolute values and sign values. That is, the soft bits may include bits corresponding to the absolute values and bits corresponding to the sign values, and the absolute values may be more affected by a transmission/reception channel state between the first node and the second node than the sign values. Through the subsampling, the absolute values may be separated from the sign values. The intra block compressor may generate compressed absolute values by performing a compression operation on the absolute values of the soft bits (S4312). In addition, the intra block compressor may generate compressed sign values by performing a compression operation on the sign values of the soft bits (S4313). The compression operation on the absolute values of the soft bits may be performed as follows.

Figure 10:
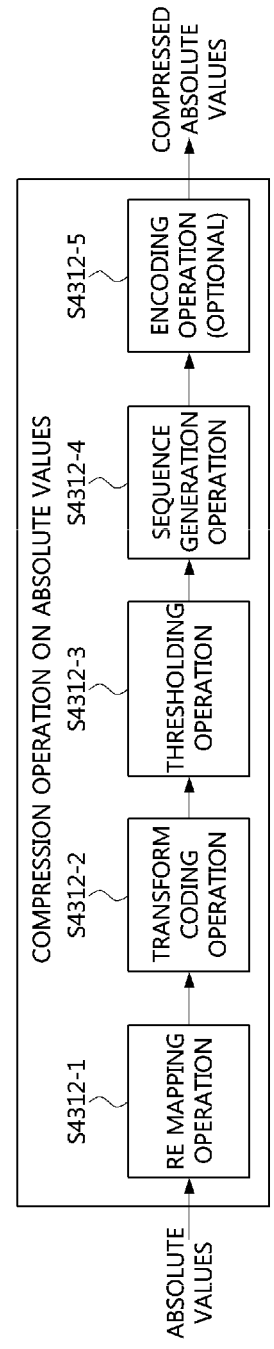
FIG. 10 is a flowchart illustrating a first exemplary embodiment of a compression operation on absolute values of soft bits.

FIG. 10 is a flowchart illustrating a first exemplary embodiment of a compression operation on absolute values of soft bits.

Referring to FIG. 10, the intra block compressor may map each of the absolute values to a resource element (RE) (S4312-1). The RE mapping operation may be performed to take advantage of the appearance of similar channel characteristics in adjacent time and frequency resources. The RE mapping operation may be performed as follows.

Figure 11:
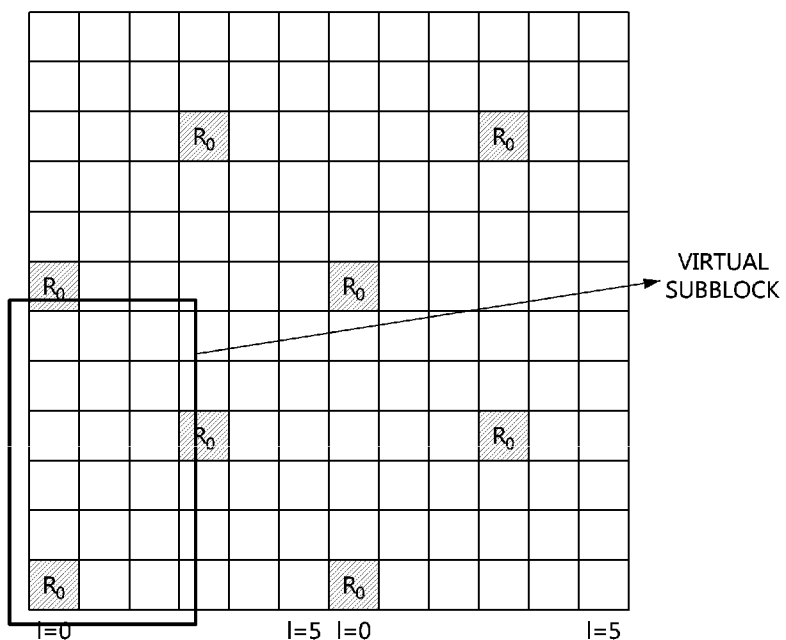
FIG. 11 is a conceptual diagram illustrating a first exemplary embodiment of a resource block to which absolute values are mapped.

FIG. 11 is a conceptual diagram illustrating a first exemplary embodiment of a resource block to which absolute values are mapped.

Referring to FIG. 11, the RE mapping operation may be performed on a block (e.g., a subset of the sequence of soft bits) basis. For example, the absolute values belonging to one block (e.g., a subset of the sequence of soft bits) may be mapped to one virtual subblock. A virtual resource block (VRB) may be composed of one or more virtual subblocks, and the size of the VRB may be equal to the size of a physical resource block (PRB).

The absolute value may be mapped to an RE (e.g., RE in the VRB or the virtual subblock) having the same location as the actual RE to which the corresponding absolute value was actually mapped. For example, in the communication between the first node and the second node, when the first absolute value is mapped to the fifth subcarrier on the first symbol in the PRB, the first absolute value may be mapped to the fifth subcarrier on the first symbol in the VRB (e.g., virtual subblock) in the RE mapping procedure.

Some of the REs constituting the VRB (e.g., virtual subblock) may be used for transmission of reference signals (e.g., channel state information-reference signal (CSI-RS), demodulation-reference signal (DM-RS), phase tracking-reference signal (PT-RS), or sounding reference signal (SRS)) instead of data. The RE used for transmission of the reference signals in the VRB (e.g., virtual subblock) may be referred to as 'RS RE'. The intra block compressor may perform interpolation on absolute values mapped to neighboring REs of the RS RE, and map a result of the interpolation to the corresponding RS RE.

Referring back to FIG. 10, after the RE mapping operation is completed, the intra block compressor may perform a transform coding operation (S4312-2). The transform coding operation may be performed based on a discrete cosine transform (DCT), a discrete Fourier transform (DFT), or the like. The transform coding operation may be performed on a virtual subblock basis. The transform coding operation may be performed as follows.

Figure 12:
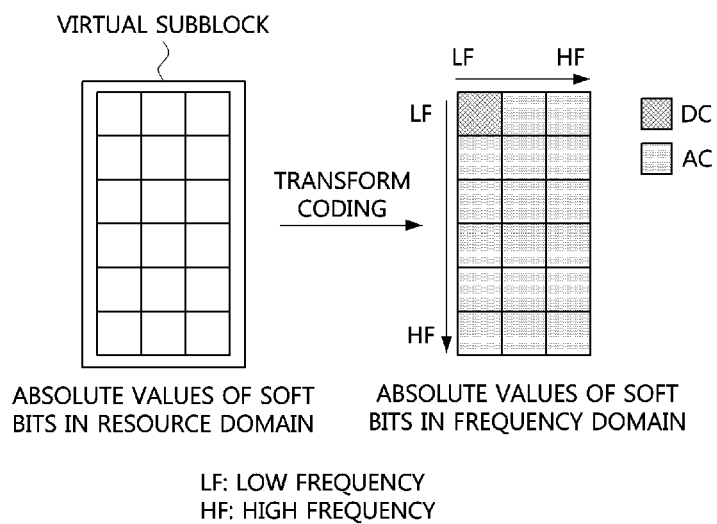
FIG. 12 is a conceptual diagram illustrating a first exemplary embodiment of a transform coding operation.

FIG. 12 is a conceptual diagram illustrating a first exemplary embodiment of a transform coding operation.

Referring to FIG. 12, when the transform coding operation is performed, the absolute values of soft bits in the resource domain may be transformed into the absolute values of soft bits in the frequency domain. The transform coding operation may be performed based on Equation 3 below.

$$X_k = \sum_{n=0}^{N-1} x_n \cos\left[\frac{\pi}{N}\left(n + \frac{1}{2}\right)k\right]$$ [Equation 3]

An inverse transform coding operation (e.g., inverse DCT (IDCT) operation) may be performed based on Equation 4 below as a reverse operation of the transform coding operation (e.g., DCT operation).

$$x_k = \frac{2}{N}\left\{\frac{1}{2}X_0 + \sum_{n=1}^{N-1} X_n \cos\left[\frac{\pi}{N}n\left(k + \frac{1}{2}\right)\right]\right\}$$ [Equation 4]

The transform coding operation may be used to perform compression using the feature of similar channel qualities in adjacent radio resources of the NTN (e.g., long distance communication). When signals having similar values in adjacent radio resources are transformed by the transform coding operation, large values may be located in a DC and ACs around the DC, and the value of the AC far from the DC may be close to zero. In order to ensure the effectiveness of the transform coding operation, the RE mapping operation may be performed such that similar absolute values are mapped to adjacent radio resources.

Referring back to FIG. 10, when the assumption that the inputs of the transform coding are similar in adjacent radio resources holds, the values of ACs having high frequencies may be replaced with '0'. Since '0' has no information amount, the compression effect may occur by deleting '0'. That is, the intra block compressor may perform a thresholding operation on the result of the transform coding operation (S4312-3). When a common threshold is used for all elements in the frequency domain transformed by the transform coding operation, the intra block compressor may change a value smaller than the common threshold value to '0' in the result of the transform coding operation. When a different threshold is used for each element in the frequency domain transformed by the transform coding operation, the intra block compressor may compare the result of the transform coding operation on the element with the threshold of the corresponding element. If the result of the transform coding operation on the element is less than the threshold of the element, the intra block compressor may change the value of the element to '0'. After the thresholding operation is completed, the operation of deleting '0' may be selectively performed in the intra block compression procedure, the inter block compression procedure, and the inter sequence compression procedure.

After the threshold holding operation is completed, the intra block compressor may perform a sequence (e.g., intra sequence) generation operation (S4312-4). The sequence generation operation may be performed based on a zigzag read scheme or a diagonal read scheme. In this case, within the sequence generated by the step S4312-4, the values of the elements having a relatively low frequency may be located adjacently, and the values (e.g., '0') of the elements having a relatively high frequency may be located adjacently. The zigzag read scheme may be performed as follows.

Figure 13A:
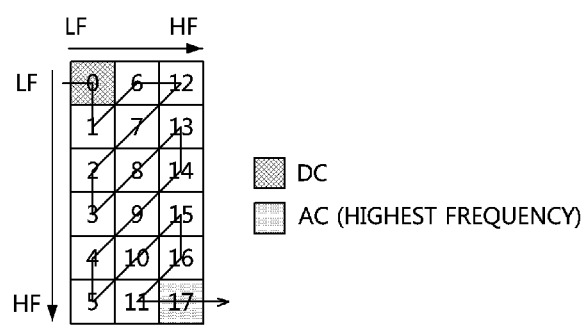
FIG. 13A is a conceptual diagram illustrating a first exemplary embodiment of a zigzag read scheme.

FIG. 13A is a conceptual diagram illustrating a first exemplary embodiment of a zigzag read scheme.

Referring to FIG. 13A, a sequence generated based on the zigzag read scheme may be (value of element #0, value of element #1, value of element #6, value of element #12, value of element #7, . . . , value of element #15, value of element #16, value of element #11, value of element #17). The diagonal read scheme may be performed as follows.

Figure 13B:
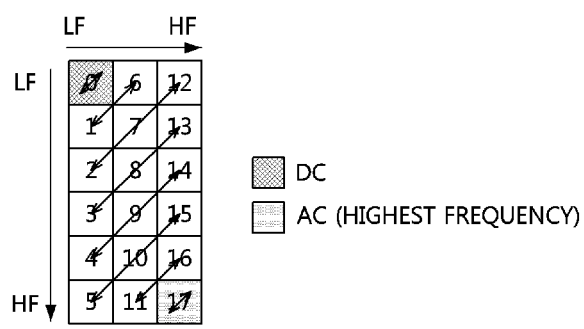
FIG. 13B is a conceptual diagram illustrating a first exemplary embodiment of a diagonal read scheme.

FIG. 13B is a conceptual diagram illustrating a first exemplary embodiment of a diagonal read scheme.

Referring to FIG. 13B, a sequence generated based on the diagonal read scheme may be (value of element #0, value of element #6, value of element #1, value of element #12, value of element #7, . . . , value of element #5, value of element #16, value of element #11, value of element #17).

Referring back to FIG. 10, after the threshold holding operation is completed, the intra block compressor may perform an encoding operation on the result of the threshold holding operation (S4312-5). The encoding operation may be performed using a run-length encoding algorithm or another encoding algorithm (e.g., a Lempel-Ziv-Welch (LZW) algorithm). The step S4312-5 may be optionally performed. When the inter block compression operation S4320 and/or the inter sequence compression operation S4330 is performed after the intra block compression operation S4310, the step S4312-5 may not be performed.

The encoding operation may be performed only once before the compressed soft bits are stored in the HARQ memory. For example, when only the intra block compression operation S4310 is performed in the compression procedure, the step S4312-5 (i.e., encoding operation) may be performed. When the intra block compression operation S4310 and the inter block compression operation S4320 are performed in the compression procedure, the encoding operation may be performed in the final step of the inter block compression operation S4320. When the intra block compression operation S4310, the inter block compression operation S4320, and the inter sequence compression operation S4330 are performed in the compression procedure, the encoding operation may be performed in the final step of the inter sequence compression operation S4330.

Referring back to FIG. 8, the intra block compressor may perform a compression operation on the sign values (S4313). The compression operation on the sign values may be performed using the LZW algorithm. The S4313 may be optionally performed. When the size of the virtual subblock is large enough, the compression operation on the sign values may be performed in the intra block compressor, and when the size of the virtual subblock is small, the compression operation on the sign values may be performed in the inter block compressor.

Inter Block Compression Operation

Figure 14:
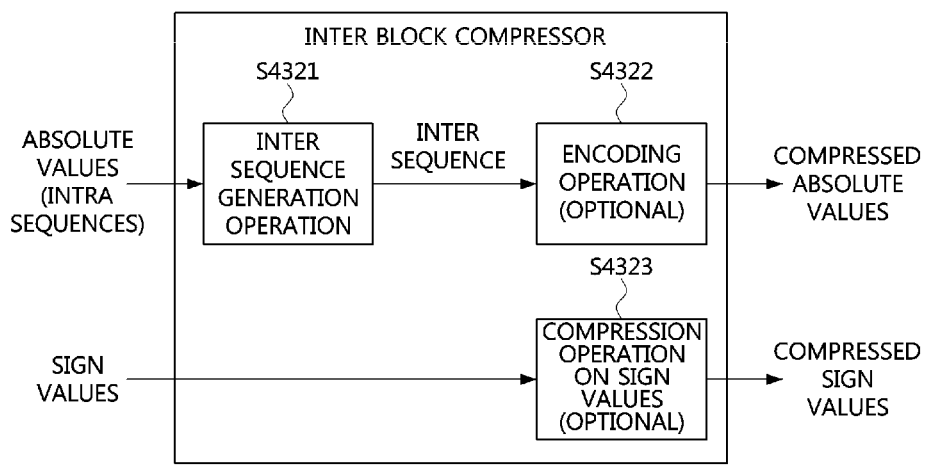
FIG. 14 is a flowchart illustrating a first exemplary embodiment of an inter block compression operation.

FIG. 14 is a flowchart illustrating a first exemplary embodiment of an inter block compression operation.

Referring to FIG. 14, the inter block compressor may perform compression on the result of the intra block compression operation on a plurality of virtual subblocks. The inputs of the inter block compressor may be the result (e.g., intra sequences) of the step S4312-4 shown in FIG. 10. When one virtual subblock includes the entire sequence of soft bits in the intra block compression operation, the inter block compression operation may not be performed.

The inter block compressor may perform an inter sequence generation operation (S4321). The inter sequence generation operation may be performed using a matrix interleaver. The inter sequence generation operation may be performed as follows.

Figure 15:
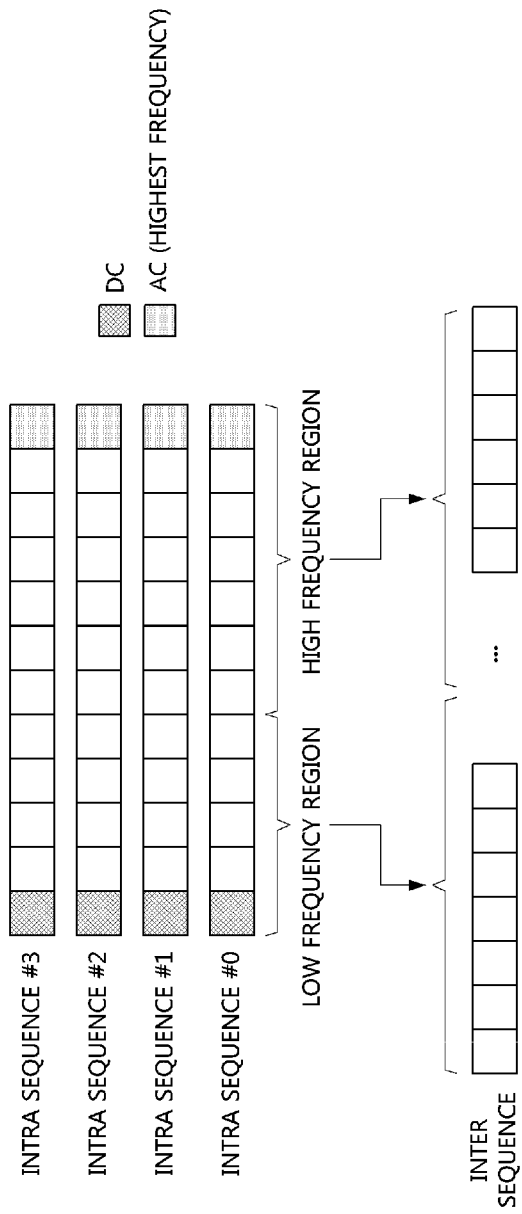
FIG. 15 is a conceptual diagram illustrating a first exemplary embodiment of an inter sequence generation operation.

FIG. 15 is a conceptual diagram illustrating a first exemplary embodiment of an inter sequence generation operation.

Referring to FIG. 15, one intra sequence may be the result of the step S4312-4 shown in FIG. 10. That is, one intra sequence may be a sequence generated based on one virtual subblock. When the entire sequence of soft bits is mapped to four virtual subblocks, four intra sequences (e.g., intra sequences #0 to #3) corresponding to the four virtual subblocks may mean the entire sequence of soft bits (e.g., the entire sequence for one TB).

When the intra sequences #0 to #3 are obtained from the intra block compressor, the inter block compressor may generate one inter sequence based on the intra sequences #0 to #3. Values in the low frequency region of the intra sequences #0 to #3 may be located in an adjacent region in the inter sequence, and values in the high frequency region of the intra sequences #0 to #3 may be located in an adjacent region in the inter sequence. The number of intra sequences included in one inter sequence may be determined in consideration of processing latency.

Referring back to FIG. 14, after the inter sequence generation operation is completed, the inter block compressor may perform an encoding operation on the inter sequence (S4322). The encoding operation may be performed using a run-length encoding algorithm or another encoding algorithm (e.g., LZW algorithm). In case that the inter sequence compression operation is performed after the inter block compression operation, the encoding operation S4322 may be omitted.

In addition, the inter block compressor may perform a compression operation on the sign values (S4323). The compression operation on the sign values may be performed using the LZW algorithm. The step S4323 may be optionally performed. When the compression operation on the sign values is performed in the intra block compressor, the inter block compressor may not perform the compression operation on the sign values.

Inter Sequence Compression Operation

Figure 16:
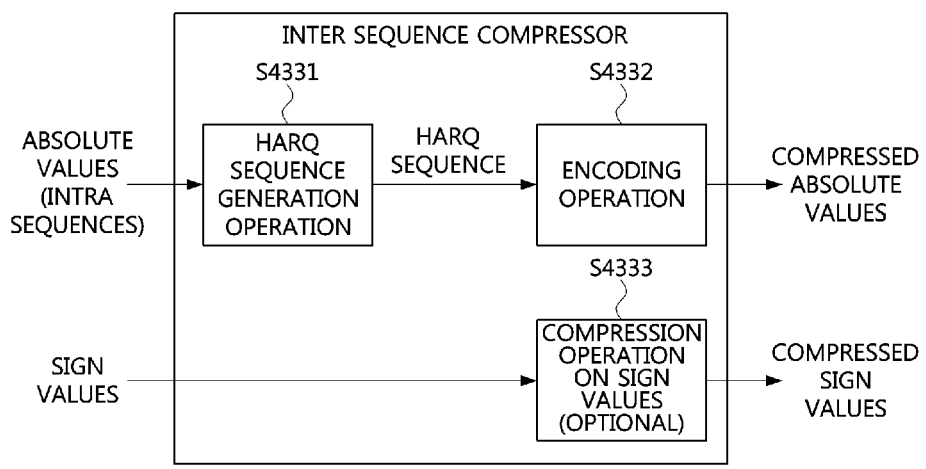
FIG. 16 is a flowchart illustrating a first exemplary embodiment of an inter sequence compression operation.

FIG. 16 is a flowchart illustrating a first exemplary embodiment of an inter sequence compression operation.

Referring to FIG. 16, the inter sequence compressor may perform compression on a plurality of inter sequences. The inputs of the inter sequence compressor may be the result (e.g., inter sequence) of the step S4321 shown in FIG. 14. The inter sequence compressor may perform an HARQ sequence generation operation (S4331). The HARQ sequence generation operation may be performed using a matrix interleaver. The HARQ sequence generation operation may be performed as follows.

FIG. 17 is a conceptual diagram illustrating a first exemplary embodiment of an HARQ sequence generation operation.

Referring to FIG. 17, one inter sequence may be the result of the step S4321 shown in FIG. 14. One inter sequence may be a sequence generated on one TB basis or on one HARQ process ID basis. When inter sequences #0 to #1 are obtained from the inter block compressor, the inter sequence compressor may generate one HARQ sequence based on the inter sequences #0 to #1. Values in the low frequency region of the inter sequences #0 to #1 may be located in an adjacent region in the HARQ sequence, and values in the high frequency region in the inter sequences #0 to #1 may be located in an adjacent region in the HARQ sequence. The number of inter sequences included in one HARQ sequence may be determined in consideration of processing latency.

Referring back to FIG. 16, after the generation of the HARQ sequence is completed, the inter sequence compressor may perform an encoding operation on the HARQ sequence (S4332). The encoding operation may be performed using a run-length encoding algorithm or another encoding algorithm (e.g., LZW algorithm). In addition, the inter sequence compressor may perform a compression operation on the sign values (S4333). The compression operation on the sign values may be performed using the LZW algorithm. The step S4333 may be optionally performed. When the compression operation on the sign values is performed in the intra block compressor or the inter block compressor, the inter sequence compressor may not perform the compression operation on the sign values.

The compression operation on the inter sequence may be performed identically or similarly to the compression operation on the intra sequence. The compression operation on the intra sequence may be performed to compress max (G) of Equation 2, and the compression operation on the inter sequence may be performed to reduce the influence of $N_{HARQ}$ and/or $N_{TB}$ of Equation 2.

The exemplary embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

What is claimed is:

1. An operation method of a first node in a communication network, the operation method comprising:
   receiving, by a processor included in the first node, a transport block (TB) from a second node;
   classifying, by the processor, total soft bits for the TB into information values and sign values;
   configuring, by the processor, the information values of the total soft bits into one or more subsets;
   performing, by the processor, a compression operation on each of the one or more subsets; and
   performing, by the processor, a compression operation on the sign values,
   wherein the each of the one or more subsets includes a part of the information values.

2. The operation method according to claim 1, wherein the total soft bits are original soft bits generated based on the TB when the TB is an initial transmitted TB, and the total soft bits are a combination of the original soft bits generated based on the TB and previous soft bits stored in a memory of the first node when the TB is a re-transmitted TB.

3. The operation method according to claim 1, wherein the performing of the compression operation on each of the one or more subsets further comprises:
   mapping each of the one or more subsets to a subblock consisting of a plurality of resource elements (REs);
   performing a transform coding operation on each of the subblocks to which the one or more subsets are mapped;
   performing a thresholding operation on a result of the transform coding operation;
   generating an intra sequence based on a result of the thresholding operation; and
   generating compressed information values by performing an encoding operation on each of intra sequences corresponding to the one or more subsets.

4. The operation method according to claim 3, wherein the intra sequence is generated based on a zigzag read scheme or a diagonal read scheme.

5. The operation method according to claim 3, wherein the encoding operation is performed based on a run-length encoding algorithm.

6. The operation method according to claim 1, wherein the compression operation on the sign values is performed based on a Lempel-Ziv-Welch (LZW) algorithm.

7. The operation method according to claim 1, wherein the performing of the compression operation on each of the one or more subsets further comprises:

mapping each of the one or more subsets to a subblock consisting of a plurality of REs;
performing a transform coding operation on each of the subblocks to which the one or more subsets are mapped;
performing a thresholding operation on a result of the transform coding operation;
generating an intra sequence based on a result of the thresholding operation;
generating one inter sequence consisting of intra sequences corresponding to the one or more subsets; and
generating compressed information values by performing an encoding operation on the one inter sequence.

8. The operation method according to claim 7, wherein the one inter sequence is generated by applying matrix interleaving to the intra sequences.

9. An operation method of a first node in a communication network, the operation method comprising:
receiving, by a processor included in the first node, a first transport block (TB) and a second TB from a second node;
configuring, by the processor, first information values included in first soft bits for the first TB into one or more first subsets;
generating, by the processor first intra sequences by performing a transform coding operation on each of the one or more first subsets;
configuring, by the processor, second information values included in second soft bits for the second TB into one or more second subsets;
generating, by the processor, second intra sequences by performing the transform coding operation on each of the one or more second subsets;
generating, by the processor, one hybrid automatic repeat request (HARQ) sequence including a first inter sequence consisting of the first intra sequences and a second inter sequence consisting of the second intra sequences; and
generating, by the processor, compressed information values by performing an encoding operation on the one HARQ sequence,
wherein the each of the one or more first subsets includes a part of the first information values and the each of the one or more second subsets includes a part of the second information. values.

10. The operation method according to claim 9, wherein the encoding operation is performed based on a run-length encoding algorithm.

11. The operation method according to claim 9, wherein the generating of the first intra sequences further comprises:
mapping each of the one or more first subsets to a subblock consisting of a plurality of resource elements (REs);
performing the transform coding operation on each of the subblocks to which the one or more first subsets are mapped;
performing a thresholding operation on a result of the transform coding operation; and
generating the first intra sequences based on a result of the thresholding operation.

12. The operation method according to claim 9, further comprising performing a compression operation on first sign values included in the first soft bits and second sign values included in the second soft bits, wherein the compression operation on the first sign values and the second sign values is performed based on a Lempel-Ziv-Welch (LZW) algorithm.

13. A first node in a communication network, the first node comprising a processor and a memory storing at least one instruction executable by the processor, wherein when executed by the processor, the at least one instruction configures the processor to:
receive a transport block (TB) from a second node;
classify total soft bits for the TB into information values and sign values;
configure the information values of the total soft bits into one or more subsets;
perform a compression operation on each of the one or more subsets; and
perform a compression operation on the sign values,
wherein the each of the one or more subsets includes a part of the information values.

14. The first node according to claim 13, wherein the total soft bits are original soft bits generated based on the TB when the TB is an initial transmitted TB, and the total soft bits are a combination of the original soft bits generated based on the TB and previous soft bits stored in a memory of the first node when the TB is a re-transmitted TB.

15. The first node according to claim 13, wherein in the performing of the compression operation on each of the one or more subsets, the at least one instruction further configures the processor to:
map each of the one or more subsets to a subblock consisting of a plurality of resource elements (REs);
perform a transform coding operation on each of subblocks to which the one or more subsets are mapped;
perform a thresholding operation on a result of the transform coding operation;
generate an intra sequence based on a result of the thresholding operation; and
generate compressed information values by performing an encoding operation on each of intra sequences corresponding to the one or more subsets.

16. The first node according to claim 15, wherein the intra sequence is generated based on a zigzag read scheme or a diagonal read scheme.

17. The first node according to claim 15, wherein the encoding operation is performed based on a run-length encoding algorithm.

18. The first node according to claim 13, wherein the compression operation on the sign values is performed based on a Lempel-Ziv-Welch (LZW) algorithm.

19. The first node according to claim 13, wherein in the performing of the compression operation on each of the one or more subsets, the at least one instruction further configures the processor to:
map each of the one or more subsets to a subblock consisting of a plurality of REs;
perform a transform coding operation on each of subblocks to which the one or more subsets are mapped;
perform a thresholding operation on a result of the transform coding operation;
generate an intra sequence based on a result of the thresholding operation;
generate one inter sequence consisting of intra sequences corresponding to the one or more subsets; and
generate compressed information values by performing an encoding operation on the one inter sequence.

20. The first node according to claim 19, wherein the one inter sequence is generated by applying matrix interleaving to the intra sequences.

\* \* \* \* \*